United States Patent
Huang et al.

(10) Patent No.: US 7,602,324 B1
(45) Date of Patent: Oct. 13, 2009

(54) A/D CONVERTER AND METHOD FOR CONVERTING ANALOG SIGNALS INTO DIGITAL SIGNALS

(75) Inventors: Chih-Haur Huang, Sinshih Township, Tainan County (TW); Kuo-Chan Huang, Sinshih Township, Tainan County (TW)

(73) Assignee: Himax Media Solutions, Inc., Sinshih Township, Tainan County (TW)

( * ) Notice: Subject to any disclaimer, the term of this patent is extended or adjusted under 35 U.S.C. 154(b) by 0 days.

(21) Appl. No.: 12/356,107

(22) Filed: Jan. 20, 2009

(51) Int. Cl.
 *H03M 1/20* (2006.01)
(52) U.S. Cl. ........................ 341/131; 341/161
(58) Field of Classification Search ................ 341/131, 341/156, 161, 162, 163
See application file for complete search history.

(56) References Cited

U.S. PATENT DOCUMENTS

| | | | | | |
|---|---|---|---|---|---|
| 3,599,204 | A | * | 8/1971 | Severin | 341/162 |
| 5,043,732 | A | * | 8/1991 | Robertson et al. | 341/156 |
| 6,064,328 | A | * | 5/2000 | Scheidig et al. | 341/155 |
| 6,172,629 | B1 | * | 1/2001 | Fetterman | 341/131 |
| 6,268,814 | B1 | * | 7/2001 | Kolsrud | 341/131 |
| 7,271,750 | B1 | * | 9/2007 | Ali | 341/155 |
| 2006/0114144 | A1 | * | 6/2006 | Lyden et al. | 341/161 |

* cited by examiner

*Primary Examiner*—Howard Williams
(74) *Attorney, Agent, or Firm*—Thomas, Kayden, Horstemeyer & Risley

(57) ABSTRACT

A method for converting analog signals into digital signals includes the steps of: superimposing a dither value on an analog input signal; sampling the superimposition of the analog input signal with the dither value to obtain a sampling signal; converting the sampling signal into corresponding digital values; correcting offsets in the digital values to generate a digital signal; and removing the dither value from the digital signal. An analog-to-digital converter is also disclosed herein.

16 Claims, 4 Drawing Sheets

US 7,602,324 B1

A/D CONVERTER AND METHOD FOR CONVERTING ANALOG SIGNALS INTO DIGITAL SIGNALS

BACKGROUND

1. Field of Invention

The present invention relates to an A/D converter. More particularly, the present invention relates to an A/D converter with a pipelined architecture.

2. Description of Related Art

Analog-to-digital converters (also called A/D converters or ADCs) are common construction blocks of electronic systems which process physical signals from transducers, electronic signal generating circuits, etc. For a conventional pipelined A/D converter, it has a number of stages of A/D converting units, each of which includes a multiplying D/A converter (MDAC) containing sampling capacitors and an OP amplifier. However, nonlinearities are usually caused by finite gain error and settling error of the OP amplifier or capacitor mismatch error, thus affecting quality of the digital output signal generated from the pipelined AND converter. Thus, it is desired to reduce the non-linearity and increase the linearity of the pipelined A/D converter.

SUMMARY

In accordance with one embodiment of the present invention, an analog-to-digital converter is provided. The analog-to-digital converter comprises a sample-and-hold amplifier (SHA), a plurality of stages of analog-to-digital converting (ADC) units, delay elements, a digital logic correction circuit and a compensation circuit. The SHA samples an analog input signal superimposed by a dither value to generate a sampling signal. The ADC units serially convert the sampling signal from the SHA into corresponding digital values. The delay elements synchronizes the digital values from the ADC units. The digital logic correction circuit corrects errors in the digital values from the delay circuit to output a digital signal. The compensation circuit modifies the digital signal by removing the dither value from the digital signal.

In accordance with another embodiment of the present invention, a method for converting analog signals into digital signals is provided. The method comprises the steps of: superimposing a dither value on an analog input signal; sampling the superimposition of the analog input signal with the dither value to obtain a sampling signal; converting the sampling signal into corresponding digital values; correcting offsets in the digital values to generate a digital signal; and removing the dither value from the digital signal.

In accordance with yet another embodiment of the present invention, a method for converting analog signals into digital signals is provided. The method comprises the steps of: generating a dither value; superimposing the dither value on an analog input signal; converting the superimposition of the analog input signal with the dither value into corresponding digital values; synchronizing the digital values; correcting offsets in the synchronized digital values to generate a digital signal; and removing the dither value from the digital signal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
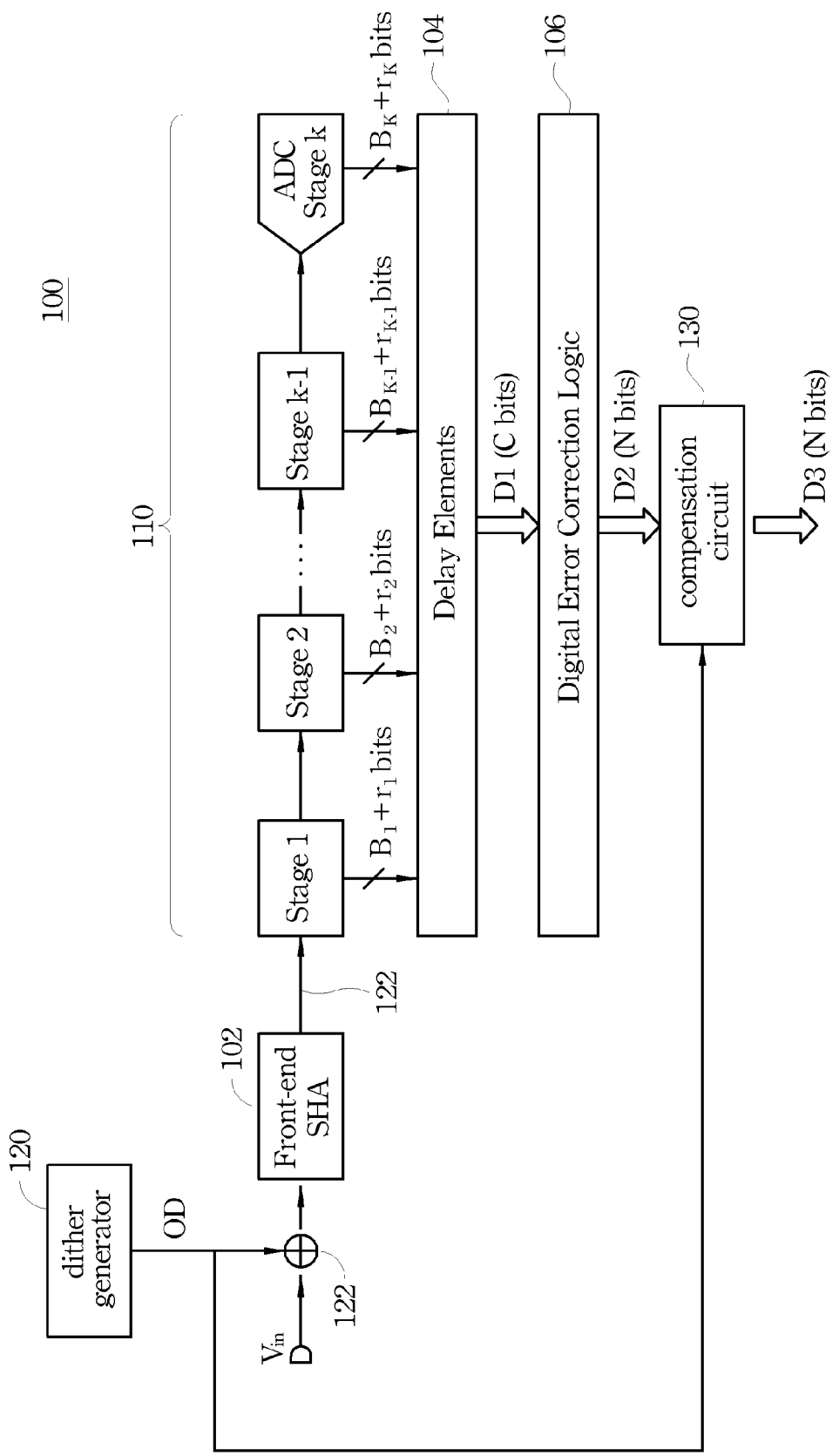
FIG. 1 illustrates a block diagram of a pipelined analog-to-digital converter (ADC) according to one embodiment of the present invention.

FIG. 1 illustrates a block diagram of a pipelined analog-to-digital converter (ADC) according to one embodiment of the present invention. The A/D converter 100 includes a front-end sample-and-hold amplifier (SHA) 102, a plurality of stages (e.g. K stages) of cascade-connected analog-to-digital converting (ADC) units 110, delay elements 104, a digital error correction logic 106, a dither generator 120, a combiner 122 and a compensation circuit 130. The dither generator 120 generates a dither value OD as an offset dither to be superimposed on an analog input signal Vin, in which the dither generator 120 can be a pseudo random number generator (PRNG). The combiner 122 has a first input receiving the analog input signal Vin, a second input coupled to the dither generator 120 to receive the dither value OD, and an output coupled to an input of the SHA 102 and outputting the superimposition of the analog input signal Vin with the dither value OD.

The SHA 102 receives and samples the superimposition of the analog input signal Vin with the dither value OD and holds the sampling signal 122 for the 1st stage of the ADC units 110. The ADC units 110 serially convert the sampling signal 122 into corresponding digital values. Specifically, each stage of the ADC units 110 generates the digital value having a resolution of $B_i+r_i$ bits, where $B_i$ represents the effective stage resolution and $r_i$ represents the redundancy for an offset correction. Each stage digitizes the residue of the previous stage, so the digital value $B_1$ outputted from the 1st stage of the ADC units 110 contains the most significant bits (MSBs) while the digital value $B_K$ outputted from the Kth stage of the ADC units 110 contains the least significant bits (LSBs). In addition, the ADC units 110 operate concurrently; that is, the 1st stage operates on the most recent sample from the SHA 102 while all other stages operate on residues from previous samples. The delay elements 104 synchronize the digital outputs from the ADC units 110 and generate a digital output D1 with C bits. The digital error correction logic 106 corrects errors or offsets in the digital output D1 and thus generates a digital output D2 with N bits.

The compensation circuit 130 modifies the digital output D2 by removing the dither value OD from the digital output D2 to generate a digital signal D3 with N bits, in which the compensation circuit 130 can further include a combiner (not shown) combining the dither value OD with the digital output D2 (i.e. removing the dither value OD from the digital output D2). In one embodiment, the compensation circuit 130 adds or deducts one or more least significant bits (LSBs) corresponding to the dither value OD from the digital output D2. For example, if the dither value OD is an offset above a reference value (e.g. common-mode voltage value) with respect to the analog input signal Vin, the compensation circuit 130 deducts one LSB corresponding to the dither value OD, from the digital output D2; on the other hand, if the dither value OD is an offset below the reference value with respect to the analog input signal Vin, the compensation circuit 130 adds one LSB corresponding to the dither value OD, into the digital output D2. Since the dither value OD is an intentionally applied form of noise and used to randomize quantization error (difference between actual analog value and quantized digital value), the non-linearity in the A/D converter 100 can be reduced based on the dither value OD, thus generating the digital signal with better quality. In addition, the dither value OD superimposed on the analog input signal Vin can be determined based on the non-linearity appearing in the digital output D2 while no dither value is superimposed on the analog input signal Vin; that is, the dither value OD should be increased if the original digital output D2 has a high degree of non-linearity.

Figure 2:
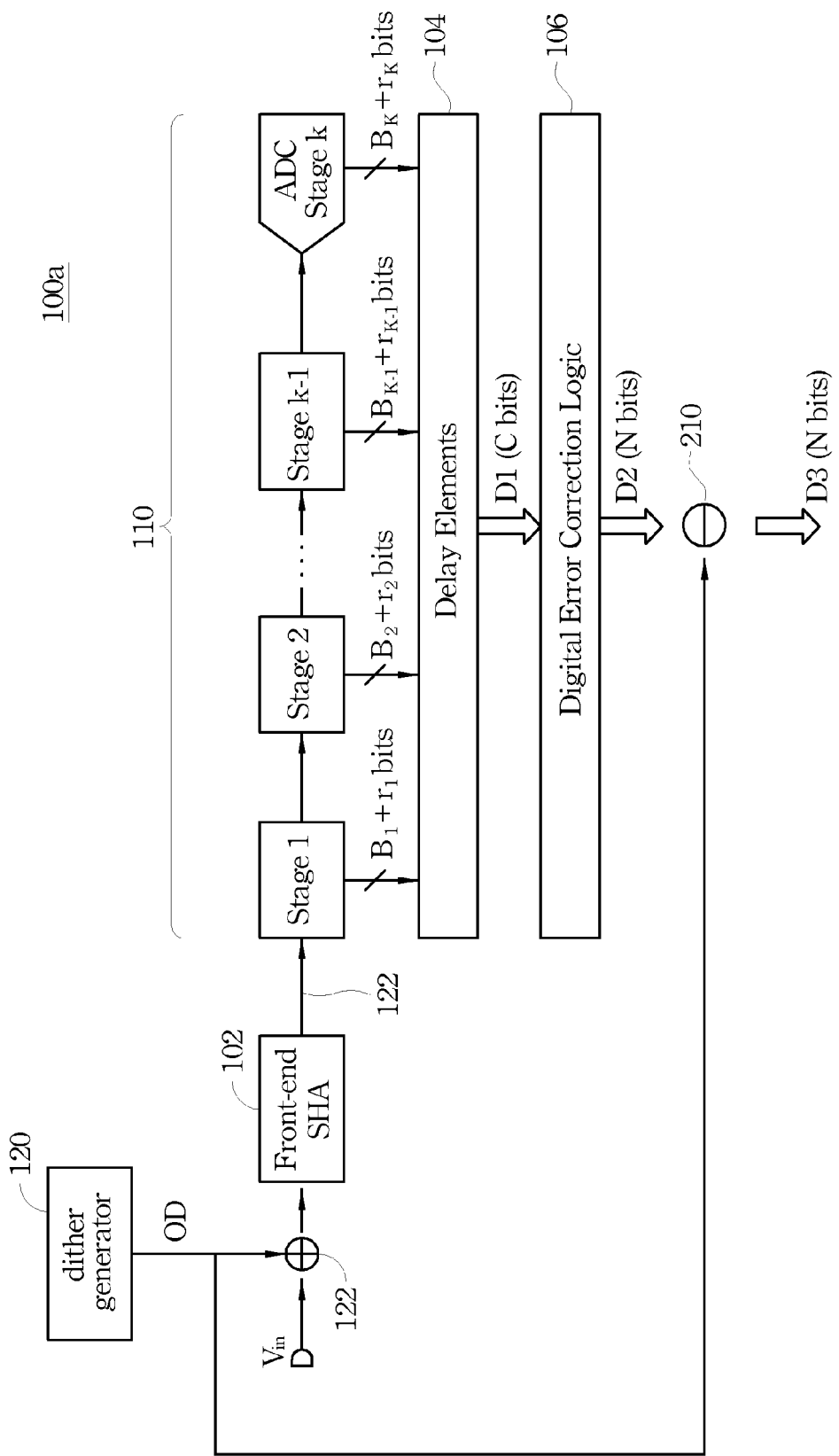
FIG. 2 illustrates a block diagram of a pipelined analog-to-digital converter (ADC) according to another embodiment of the present invention.

FIG. 2 illustrates a block diagram of a pipelined analog-to-digital converter (ADC) according to another embodiment of the present invention. Compared to FIG. 1, the compensation circuit 130 is implemented by a combiner 210 which removes the dither value OD from the digital output D2 to output the digital signal D3. The combiner 210 has a first input coupled to the digital logic correction circuit 106 to receive the digital output D2, a second input coupled to the dither generator 120 to receive the dither value OD, and an output outputting the modified digital signal D3.

Figure 3:
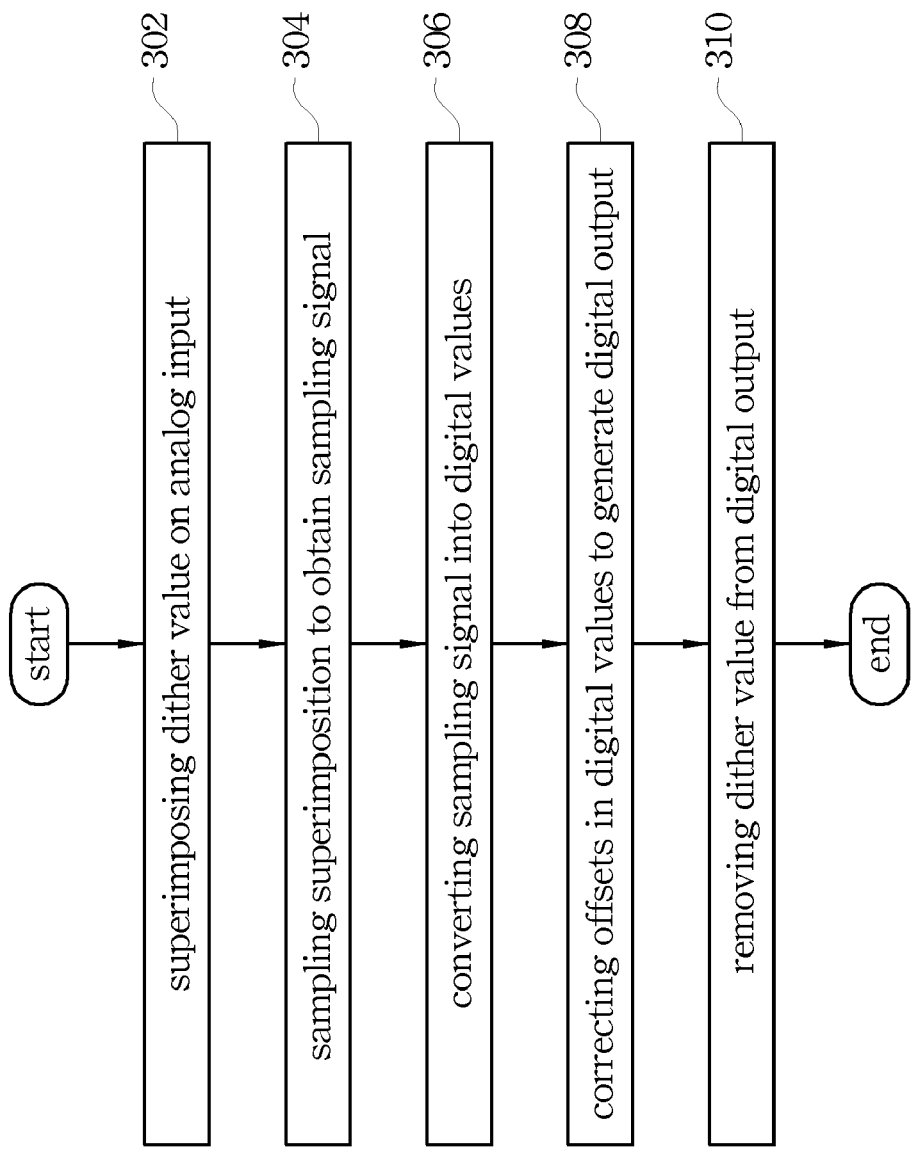
FIG. 3 illustrates a flow chart of a method for converting analog signals into digital signals according to one embodiment of the present invention.

FIG. 3 illustrates a flow chart of a method for converting analog signals into digital signals according to one embodiment of the present invention. Refer to FIGS. 1 and 3. First, the dither value OD is superimposed on the analog input signal Vin (Step 302). Then, the superimposition of the analog input signal Vin with the dither value OD is sampled (Step 304) by the SHA 102 to obtain the sampling signal 122. After that, the sampling signal 122 is converted into corresponding digital values Bi+ri (Step 306) by the ADC units 110. Afterwards, offsets or errors in the digital values Bi+ri are corrected (Step 308) by the digital error correction logic 106 to generate the digital output D2. Then, the dither value OD is removed from the digital output D2 (Step 310) to generate the digital signal D3.

In Step 310, if the dither value OD is a positive offset with respect to a reference value or an average of the analog input signal Vin, one or more least significant bits (LSBs) corresponding to the dither value OD are deducted from the digital output D2; on the other hand, if the dither value OD is a negative offset with respect to the reference value or the average of the analog input signal Vin, one or more LSBs corresponding to the dither value OD is added into the digital output D2, thus compensating the digital output D2 and generating the digital signal D3 corresponding to the analog input signal Vin. In addition, the dither value OD superimposed on the analog input signal Vin can be determined based on the non-linearity appearing in the original digital output D2 while no dither value is superimposed on the analog input signal Vin.

Figure 4:
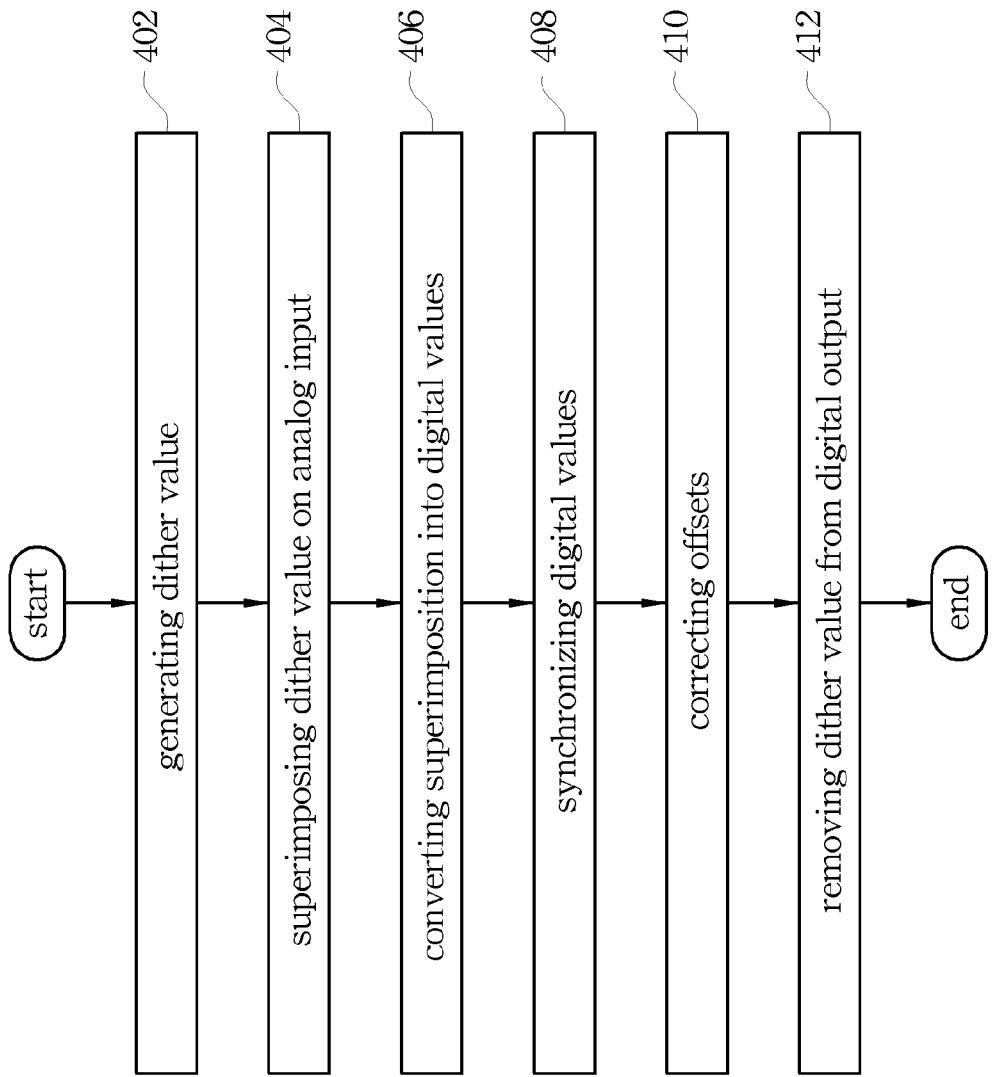
FIG. 4 illustrates a flow chart of a method for converting analog signals into digital signals according to another embodiment of the present invention.

FIG. 4 illustrates a flow chart of a method for converting analog signals into digital signals according to another embodiment of the present invention. Refer to FIGS. 1 and 4. First, the dither value OD is generated (Step 402) by the dither generator 120. Then, the dither value OD is superimposed on the analog input signal Vin (Step 404). After that, the superimposition of the analog input signal Vin with the dither value OD is converted into corresponding digital values Bi+ri (Step 406) by the ADC units 110. Afterwards, the digital values Bi+ri are synchronized (Step 408) by the delay elements 104 to generate the digital output D1. Thereafter, offsets or errors in the digital output D1 are corrected (Step 410) by the digital error correction logic 106 to generate the digital output D2. Eventually, the dither value OD is removed from the digital output D2 to generate the digital signal D3 (Step 412).

In Step 412, if the values of the analog input signal Vin increase with respect to a reference value or an average of the analog input signal Vin based on the dither value OD, one or more LSBs corresponding to the dither value OD are deducted from the digital output D2; on the other hand, if the values of the analog input signal Vin decrease with respect to the reference value or the average of the analog input signal Vin based on the dither value OD, one or more LSBs corresponding to the dither value OD are added into the digital output D2. In addition, the dither value OD superimposed on the analog input signal Vin can be determined based on the non-linearity appearing in the original digital output D2 while no dither value is superimposed on the analog input signal Vin. Furthermore, the removing step described in the foregoing embodiments may be saved in practice.

For the foregoing embodiments, the A/D converter and the method for converting analog signals into digital signals can be employed to reduce the non-linearity and increase the linearity of the digital output signal, such that the digital output signal from the A/D converter can be improved and have good quality.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. An analog-to-digital converter, comprising:
    a sample-and-hold amplifier (SHA) for sampling an analog input signal superimposed by a dither value to generate a sampling signal;
    a plurality of stages of analog-to-digital converting (ADC) units for serially converting the sampling signal from the SHA into corresponding digital values;
    delay elements for synchronizing the digital values from the ADC units;
    a digital logic correction circuit for correcting errors in the digital values from the delay circuit to output a digital signal; and
    a compensation circuit for modifying the digital signal by removing the dither value from the digital signal;
    wherein the dither value superimposed on the analog input signal is determined based on non-linearity appearing in the digital signal while no dither value is superimposed on the analog input signal.

2. The analog-to-digital converter as claimed in claim 1, further comprising:
    a dither generator for generating the dither value to be superimposed on the analog input signal.

3. The analog-to-digital converter as claimed in claim 2, wherein the dither generator is a pseudo random number generator.

4. The analog-to-digital converter as claimed in claim 2, further comprising:
    a combiner having a first input receiving the analog input signal, a second input coupled to the dither generator to receive the dither value, and an output coupled to an input of the SHA and outputting the superimposition of the analog input signal with the dither value.

5. The analog-to-digital converter as claimed in claim 1, wherein the compensation circuit adds or deducts one or more least significant bits corresponding to the dither value from the digital signal.

6. The analog-to-digital converter as claimed in claim 1, wherein the compensation circuit further comprises:
 a combiner having a first input coupled to the digital logic correction circuit to receive the digital signal, a second input coupled to the dither generator to receive the dither value, and an output outputting the modified digital signal.

7. A method for converting analog signals into digital signals, comprising:
 superimposing a dither value on an analog input signal;
 sampling the superimposition of the analog input signal with the dither value to obtain a sampling signal;
 converting the sampling signal into corresponding digital values;
 correcting offsets in the digital values to generate a digital signal; and
 removing the dither value from the digital signal;
 wherein the dither value superimposed on the analog input signal is determined based on non-linearity appearing in the digital signal while no dither value is superimposed on the analog input signal.

8. The method as claimed in claim 7, wherein the dither value is a positive offset with respect to a reference value of the analog input signal.

9. The method as claimed in claim 8, wherein the removing step further comprises:
 deducting one or more least significant bits corresponding to the dither value from the digital signal.

10. The method as claimed in claim 7, wherein the dither value is a negative offset with respect to a reference value of the analog input signal.

11. The method as claimed in claim 10, wherein the removing step further comprises:
 adding one or more least significant bits corresponding to the dither value into the digital signal.

12. A method for converting analog signals into digital signals, comprising:
 generating a dither value;
 superimposing the dither value on an analog input signal;
 converting the superimposition of the analog input signal with the dither value into corresponding digital values;
 synchronizing the digital values;
 correcting offsets in the synchronized digital values to generate a digital signal; and
 removing the dither value from the digital signal;
 wherein the dither value superimposed on the analog input signal is determined based on non-linearity appearing in the digital signal while no dither value is superimposed on the analog input signal.

13. The method as claimed in claim 12, wherein values of the analog input signal increase with respect to a reference value based on the dither value.

14. The method as claimed in claim 13, wherein the removing step further comprises:
 deducting one or more least significant bits corresponding to the dither value from the digital signal.

15. The method as claimed in claim 12, wherein values of the analog input signal decrease with respect to a reference value based on the dither value.

16. The method as claimed in claim 15, wherein the removing step further comprises:
 adding one or more least significant bits corresponding to the dither value into the digital signal.

* * * * *